(12) United States Patent
Baur et al.

(10) Patent No.: US 8,569,079 B2
(45) Date of Patent: Oct. 29, 2013

(54) METHOD FOR PRODUCING AN OPTOELECTRONIC SEMICONDUCTOR COMPONENT

(75) Inventors: Elmar Baur, Regensburg (DE); Alexander Heindl, Abensberg (DE); Bernd Bohm, Regensburg (DE); Patrick Rode, Regensburg (DE); Heribert Zull, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 46 days.

(21) Appl. No.: 13/322,662

(22) PCT Filed: May 3, 2010

(86) PCT No.: PCT/EP2010/055986
§ 371 (c)(1),
(2), (4) Date: Nov. 28, 2011

(87) PCT Pub. No.: WO2010/136304
PCT Pub. Date: Dec. 2, 2010

(65) Prior Publication Data
US 2012/0070927 A1    Mar. 22, 2012

(30) Foreign Application Priority Data
May 29, 2009   (DE) .......................... 10 2009 023 355

(51) Int. Cl.
*H01L 21/00*    (2006.01)
(52) U.S. Cl.
USPC ....................................................... 438/22
(58) Field of Classification Search
None
See application file for complete search history.

(56) References Cited

U.S. PATENT DOCUMENTS

| | | | |
|---|---|---|---|
| 6,943,117 B2 * | 9/2005 | Jeong et al. | 438/694 |
| 7,100,263 B2 * | 9/2006 | Imada et al. | 29/514 |
| 7,343,857 B2 * | 3/2008 | Sakuarai et al. | 101/483 |
| 7,384,809 B2 * | 6/2008 | Donofrio | 438/29 |
| 2003/0034329 A1 * | 2/2003 | Chou | 216/44 |
| 2003/0215577 A1 * | 11/2003 | Willson et al. | 427/458 |
| 2005/0202350 A1 | 9/2005 | Colburn et al. | |
| 2006/0151428 A1 | 7/2006 | Windisch et al. | |
| 2007/0018186 A1 | 1/2007 | Shin et al. | |
| 2007/0205525 A1 | 9/2007 | Engl et al. | |
| 2008/0135866 A1 | 6/2008 | Donofrio | |
| 2009/0053656 A1 | 2/2009 | Yanagisawa | |
| 2011/0129956 A1 * | 6/2011 | Polito et al. | 438/71 |

FOREIGN PATENT DOCUMENTS

| | | |
|---|---|---|
| DE | 103 06 779 | 7/2004 |
| DE | 10 2006 024 423 | 8/2007 |
| WO | 2005/048361 | 5/2005 |

\* cited by examiner

*Primary Examiner* — Scott B Geyer
(74) *Attorney, Agent, or Firm* — DLA Piper LLP (US)

(57) ABSTRACT

A method for producing an optoelectronic semiconductor component includes providing a first wafer having a patterned surface, wherein the patterned surface is formed at least in places by elevations having first and second heights, wherein the first height is greater than the second height; providing a second wafer; applying a photoresist to outer areas of the second wafer; patterning a surface of the photoresist facing away from the second wafer by impressing the patterned surface of the first wafer into the photoresist, wherein the elevations are impressed as trenches having a first and second depth into the photoresist; applying a patterning method to the patterned surface of the photoresist, wherein the structure applied on the photoresist is transferred at least in places to the outer area of the second wafer.

11 Claims, 2 Drawing Sheets

METHOD FOR PRODUCING AN OPTOELECTRONIC SEMICONDUCTOR COMPONENT

RELATED APPLICATIONS

This is a §371 of International Application No. PCT/EP2010/055986, with an international filing date of May 3, 2010, which is based on German Patent Application No. 10 2009 023 355.5 filed on May 29, 2009, the subject matter of which is incorporated by reference.

TECHNICAL FIELD

This disclosure relates to a method for producing an optoelectronic semiconductor component.

BACKGROUND

DE 103 067 79 A1 discloses a method for roughening a surface of a body and optoelectronic component. However, it could be helpful to provide a method for patterning a wafer surface which saves time and is furthermore cost-effective.

SUMMARY

We provide a method for producing an optoelectronic semiconductor component including providing a first wafer having a patterned surface, wherein the patterned surface is formed at least in places by elevations having first and second heights, wherein the first height is greater than the second height; providing a second wafer; applying a photoresist to outer areas of the second wafer; patterning a surface of the photoresist facing away from the second wafer by impressing the patterned surface of the first wafer into the photoresist, wherein the elevations are impressed as trenches having a first and second depth into the photoresist; applying a patterning method to the patterned surface of the photoresist, wherein the structure applied on the photoresist is transferred at least in places to the outer area of the second wafer.

We also provide a method for producing an optoelectronic semiconductor component including providing a first wafer having a patterned surface, wherein the patterned surface is formed at least in places by elevations having first and second heights, wherein the first height is greater than the second height; providing a second wafer; applying a photoresist to outer areas of the second wafer; patterning a surface of the photoresist facing away from the second wafer by impressing the patterned surface of the first wafer into the photoresist, wherein the elevations are impressed as trenches having a first and second depth into the photoresist; applying a patterning method to the patterned surface of the photoresist, wherein the structure applied on the photoresist is transferred at least in places to the outer area of the second wafer, wherein the patterning method consists of exactly one dry-chemical etching and exactly one wet-chemical etching process, the dry-chemical etching process is applied at least to a region freed of the photoresist, the photoresist is insensitive relative to the dry-chemical etching process, and the wet-chemical etching process is applied to the patterned surface of the photoresist.

DETAILED DESCRIPTION

Figure 1A:
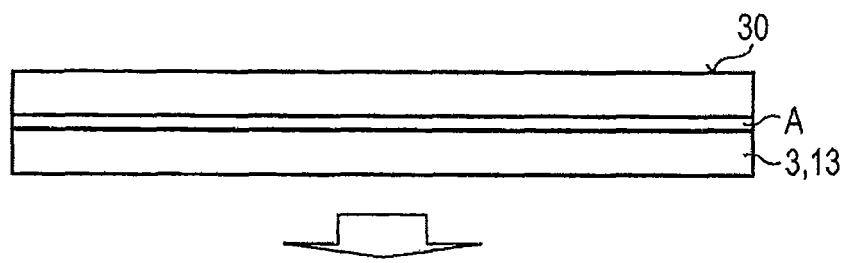
FIGS. 1A, 1B and 1C and FIGS. 2A, 2B, 2C and 2D show individual manufacturing steps for production in accordance with examples of our method.

We provide a first wafer having a patterned surface and a second wafer. The first wafer and the second wafer can be disks or plates.

The first wafer has a patterned surface. In this context, "patterned" means that elevations are situated at least in places on the surface, for example, at the top side on a top area of the first wafer. The patterned surface can be formed for example with prefabricated, regular structures introduced into the top area in a controlled manner.

The patterned surface is formed at least in places by elevations having a first and second height, wherein the first height is greater than the second height. Preferably, the first height is higher than the second height at least by a factor of 1.5.

In this context, "height" means the maximum vertical extent of an elevation, wherein "vertical" means the direction perpendicular to a main extension plane of the first wafer.

The elevations having a first and second height can then mutually alternate in a lateral direction, that is to say parallel to the top area of the first wafer, for example periodically, be separate from one another and/or be arranged in different regions of the first wafer.

It is likewise possible for the elevations having a first and second height to be situated at all places of the top area.

In this context, it is furthermore conceivable for the patterned surface to have elevations for example having one or a plurality of further heights. However, the elevations having a first height are always higher than elevations having any further height.

In a next step, a photoresist may be applied to the outer areas of the second wafer.

The surface of the photoresist which faces away from the second wafer may be patterned by impressing the patterned surface of the first wafer into the photoresist, wherein the elevations are impressed as trenches having a first and second depth into the photoresist.

If the patterned surface of the first wafer faces that surface of the photoresist which faces away from the second wafer, then the first wafer and the second wafer can be brought together and pressed together, for example, such that the patterned surface of the first wafer is impressed at least in places into the surface of the photoresist. In this regard, "impressing" means that, at places at which elevations are situated on the surface of the first wafer, corresponding trenches are reproduced on the surface of the photoresist. Preferably, after the impressing process, the first wafer is removed from the second wafer. The thickness of the photoresist is preferably dimensioned such that after the pressing-together process at the places of the photoresist at which elevations having a first height have been impressed, the photoresist only has a thickness which is negligible relative to the differences in height of the elevations of the first wafer.

The photoresist is a soft material which can deform during the process of pressing together the two wafers. By way of example, the photoresist is formed with a light-sensitive novolac resin. After removal of the second wafer from the photoresist, the patterned surface of the photoresist maintains its surface structure. In other words, the impressing operation is a process in which the surface of the photoresist is permanently patterned. It is likewise possible for a plastically deformable material to be used in addition to or instead of the photoresist, the material, for instance after a subsequent curing process, being permanently patterned. The material can be, for example, a material which is formed with a silicon oxide or silicon dioxide.

A patterning method may be applied to the patterned surface of the photoresist, wherein the structure applied to the photoresist is transferred at least in places to the outer area of the second wafer. The outer area is the surface of the second wafer which faces the photoresist and which is covered by the photoresist. That is to say that the structure situated on the photoresist is transferred to the outer area of the second semiconductor wafer at least in places using the patterning method.

Before the patterning method is applied, a curing process may be applied to the photoresist. The curing process can involve irradiating the photoresist with UV light or thermal treatment. Preferably, the curing process is applied to the photoresist before the first wafer is removed from the second wafer. If the photoresist is replaced by some other patternable material, then it is likewise conceivable for the curing process to be applied to this material as well.

First, a first wafer having a patterned surface may be provided, wherein the patterned surface is formed at least in places by elevations having a first and second height. The first height is greater than the second height. Onto a second wafer provided, a photoresist is applied to the outer areas of the second wafer. In a next step, the surface of the photoresist which faces away from the second wafer is patterned by impressing the patterned surface of the first wafer into the photoresist. Afterward, a patterning method is applied to the patterned surface of the photoresist, wherein the structure applied to the photoresist is transferred at least in places to the outer area of the second wafer.

In this case, the method for producing an optoelectronic semiconductor component as described here is based, inter alia, on the insight that the patterning of a wafer surface, for example, of a semiconductor chip which has two or more patterning profiles having different etching depths can be associated with great complexity and at the same time is cost-intensive in this case. By way of example, introducing two different patterning profiles each having different etching depths is carried out in at least two independent process sequences. Each of the process sequences consists of pretreatment, photolithography, etching, resist stripping and cleaning and also final visual inspection. A combination of the two process sequences is not possible in this case. One reason for this is that a suitable etching mask for creating a corresponding end profile cannot be realized.

To be able to dispense with a separate succession of individual process sequences for creating patterning profiles each having different depths and thus to provide a time-saving and cost-effective method for patterning a wafer surface, the method uses the concept of first providing a first wafer having a patterned surface. The patterned surface is formed at least in places by elevations having a first and second height, wherein a first height is greater than a second height. The patterned surface of the first wafer serves, in the following method, as a stencil within the production process. The elevations having a first depth are therefore, for example, the stencil-like original for a first patterning profile. The same correspondingly applies to the elevations having a second depth, which can be a stencil-like original for a second patterning profile. The aim of the method, then, is to provide patternings of a wafer surface having different etching depths in a single process sequence. For this purpose, by way of example, a second wafer is provided, on which a photoresist is applied. After impressing the patterned surface of the first wafer into the photoresist, it is possible, after applying a patterning method, to transfer the patterned surface of the photoresist at least in places into the outer area of the second wafer. Therefore, patternings having different etching depths can be combined in one process sequence. This combination makes it possible to obviate separate process sequences for creating individual patterning profiles.

By virtue of the fact that the patterned surface of the first wafer can be used multiply as a stencil, the operation can be repeated and it is thus possible to produce a multiplicity of further wafers with an applied structure on their respective outer areas.

The possibility of providing a patterned surface consisting of a combination of different patterning profiles in one process sequence and the reuse of the first wafer as a stencil therefore not only lead to cost savings in the production method, but likewise enable fast and time-saving production.

The patterning method may be a single dry-chemical etching process. Examples of appropriate methods include reactive ion etching (RIE), ion beam etching (IBE) and chemically assisted ion beam etching (CAIBE=Chemical Assistant Ion Beam Etching). By way of example, it is also appropriate to use, as a dry etching method, a method using a high-density plasma such as, for example, an inductively coupled plasma etching method (ICP=Inductive Coupled Plasma), ECR plasma (ECR=Electron Cyclotron Resonance) or a helicon plasma. Dry etching methods have the advantage, in the case of our method, of having a preferred direction during etching (anisotropy). On account of the anisotropy, it is possible to produce good aspect ratios, that is to say very steep structures in the body to be etched.

Before the patterning method is applied, the photoresist may be removed from the outer areas of the second wafer at the places at which the trenches having a first depth are pressed into the photoresist. Removal of the photoresist can take place, for example, by "blasting off" or "polishing". Preferably, the photoresist is removed by a plasma etching process, wherein, with further preference, the photoresist is removed only at places at which the trenches having a first depth are impressed into the photoresist. After removal, those places of the outer area of the second wafer which have been freed of the photoresist are uncovered. In other words, the outer area at these places is not covered by any material and is freely visible to an external observer.

The patterning method may consist of at least one dry- and one wet-chemical etching processing. In this context, "wet-chemical" means that etching liquids are applied to the patterned surface of the photoresist and the photoresist is etched away by a chemical reaction. If the etching liquid reaches the outer area of the second wafer, then in this second wafer, too, etched-in structures arise, which can be set and configured depending on the concentration of the etching constituents in the etching liquid. By way of example, the wet-chemical etching process is an etching process by potassium hydroxide, hydrochloric acid and/or mixtures of sulfuric acid/peroxides/water.

By way of example, the patterning method consists of exactly one dry- and one wet-chemical etching process. If the photoresist is then removed at the places at which the trenches having a first depth have been reproduced into the photoresist, trenches having a first depth can first be introduced into the second wafer by the dry-chemical etching process.

In a further step, the wet-chemical etching process for reproducing the trenches having a second depth into the second wafer can then be applied to the uncovered places of the photoresist.

Selectivity of the etching process, with respect to the materials of the photoresist and of the second wafer, is preferably set at 1:1, such that the surface patterning of the photoresist is transferred as precisely as possible into the outer area of the second wafer.

The first wafer may be a semiconductor wafer. The first wafer is then formed in each case with at least one semiconductor material.

The first wafer may be formed from a plastics material. That is to say that the first wafer is then formed with a "readily patternable" material. By way of example, the plastics material is formed with a polydimethylsiloxane resist (PDMS). This advantageously enables cost-effective mass production.

The second wafer may be a semiconductor wafer. The second wafer is then formed in each case with at least one semiconductor material. Preferably, the second wafer is then formed with a nitride-, phosphide- or arsenide-based compound semiconductor material.

Compound semiconductor materials such as nitride, phosphide and arsenide compound semiconductors, are particularly suitable for the formation of a semiconductor layer sequence for efficient semiconductor chips, in particular of active regions/layers having a high quantum efficiency.

Furthermore, one or a plurality of layers composed of a semiconductor material can be deposited epitaxially at least in places both on the first and on the second wafer.

The second wafer may have at least one active zone suitable for generating electromagnetic radiation. By way of example, the second wafer has a plurality of active zones.

The first wafer may deviate in its maximum diameter by at most 20%, preferably by at most 10%, especially preferably by at most 5%, from the maximum diameter of the second wafer. That is to say that the two wafers have approximately the same dimensions or dimension laterally. In this context, "laterally" means in directions parallel to the main extension plane of the first or of the second wafer. It is likewise conceivable for the maximum diameter of the first wafer to be less than the maximum diameter of the second wafer such that the photoresist is patterned, for example, by multiple repetition of the impressing operation ("step and repeat" method).

By way of example, the two wafers can be circular or circle-like disks. This advantageously ensures that the first wafer and the second wafer are as congruent as possible when they are brought together, and this minimizes regions both on the first wafer and on the second wafer which do not belong or contribute to the patterning process. It is likewise possible for the two wafers to be rectangular disks or disks deviating arbitrarily therefrom.

The trenches having a first depth introduced into the second wafer may extend at least as far as the active zone. That is to say that the trenches having a first depth run at least between the active zone and the outer area of the second wafer and at these places perforate the intervening material layers.

The trenches having a first depth may perforate the at least one active zone of the second wafer. At the places at which the trenches having a first depth run, the at least one active zone is then "subdivided". If the second wafer has a plurality of active zones, then the trenches having a first depth can also perforate all the active zones. Preferably, the trenches having a first depth have a maximum depth of 3 to 8 µm, preferably of 4 to 7 µm, especially preferably of 6 µm. By way of example, the trenches having a first depth are embodied in "U"- or "V"-shaped fashion.

The trenches having a first depth may laterally surround the trenches having a second depth. By way of example, the trenches having a first depth enclose, in a plan view, a circular, rectangular or differently embodied region. The region enclosed by the trenches having a first depth then has the trenches having a second depth.

The trenches having a second depth may form a coupling-out structure. Preferably, the trenches having a second depth are then arranged in each case in a region, wherein the regions are separated from one another in each case by at least one trench having a first depth. Preferably, the trenches having a second depth then have a maximum depth of 0.5 to 3 µm, especially preferably a maximum depth of 1 to 2 µm. In this context, "coupling-out structure" then means that the trenches having a second depth in each case form a radiation coupling-out area of a semiconductor chip. The radiation coupling-out area of a semiconductor chip forms the surface through which the electromagnetic radiation generated by the semiconductor chip is coupled out. The coupling-out structure then increases the coupling-out efficiency of a semiconductor chip. "Coupling-out efficiency" is the ratio of luminous energy actually coupled out from the semiconductor chip to the luminous energy generated primarily within the semiconductor chip.

By way of example, the trenches having a second depth are also embodied in "U"- or "V"-shaped fashion. If the trenches are embodied in "V"-shaped fashion, then it is conceivable for pyramidal elevations to be formed in each case between the trenches.

Each pyramidal elevation is a polyhedron and is delimited by a lateral area, a base area and a top area. The lateral area has at least three side areas which converge and laterally delimit the top area. The base area is laterally delimited by the side areas of the pyramidal elevation. The side areas of the pyramidal elevation end in the second wafer and form the base area there. Base and top areas of the pyramidal elevation are therefore opposite one another and are connected to one another via the side areas. In a lateral section through such a pyramidal elevation, the pyramidal elevation has at least two side areas, a top area and a base area. Preferably, top and base areas are embodied in hexagonal fashion. Preferably, the ratio of the area content of top to base area is 1/5 or less.

It can be shown that a radiation coupling-out area of a semiconductor chip that is in a pyramidal fashion has an increased coupling-out efficiency in comparison with a differently embodied structure of the radiation coupling-out area.

The second wafer may be singulated into individual radiation-emitting semiconductor chips in the region of the trenches having a first depth. Preferably, the singulation is effected at those places of the second wafer at which the trenches having a first depth run. Advantageously, the trenches having a first depth can then be used as "desired breaking places", for example, at which the second wafer is singulated into individual semiconductor chips. It is likewise possible for the second wafer to be singulated into individual semiconductor chips at the places of the trenches having a first depth by sawing, cutting or high-energy laser light.

The method described here will be explained in greater detail below on the basis of examples and the associated figures.

In the examples and the figures, identical or identically acting constituent parts are in each case provided with the same reference symbols. The elements illustrated should not be regarded as true to scale. Moreover, individual elements may be illustrated with an exaggerated size to afford a better understanding.

Figure 1B:
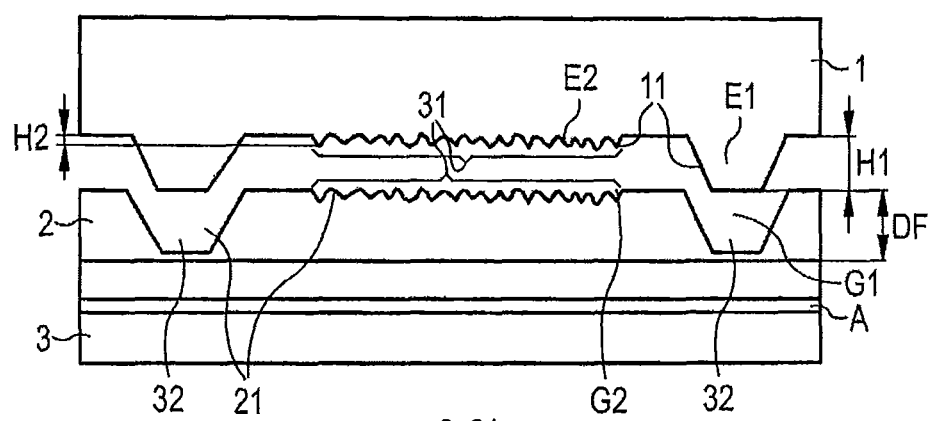
Figure 1C:
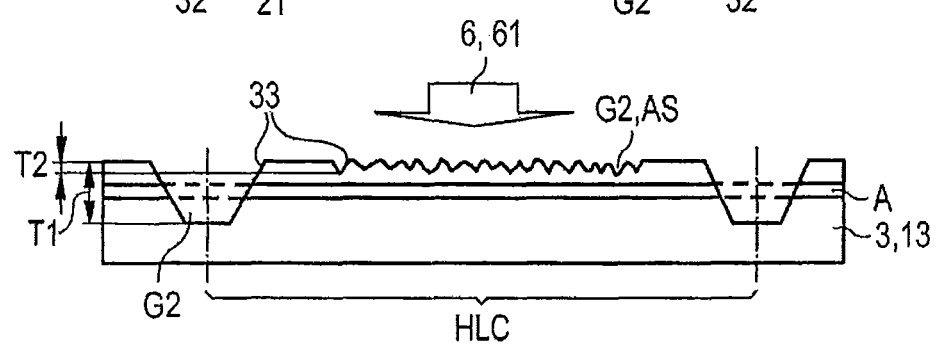

FIGS. 1A, 1B and 1C show individual manufacturing steps for producing a patterned surface 33 of a wafer 3.

The aim of the method is to provide a patterned surface of the wafer 3, which surface is formed at least in places with two different patterning profiles having different depths. That is to say that the patterned surface of the wafer 3 has, after the production method has been applied, trenches having a first depth G1 and a coupling-out structure AS, formed by trenches having a second depth G2. The wafer 3 is a semiconductor wafer 13 containing phosphide- and/or arsenide-based compound semiconductor materials. It is likewise possible for the wafer 3 to contain nitride-based compound semiconductor materials. The semiconductor wafer 13 has an epitaxially grown semiconductor layer sequence comprising at least one active zone A suitable for generating radiation.

First, a wafer 1 is provided as shown in FIG. 1A. The wafer 1 can be formed with a semiconductor material or a plastics material. A photoresist 2 is applied in the form of a layer on an outer area 30 of the wafer 3. By way of example, the photoresist 2 is formed with a light-sensitive novolac resin. Both the wafer 1 and the wafer 3 are disks which, in a plan view, in each case form a circular area and in this case have the diameter D.

The wafer 1 now has a patterned surface 11 formed by elevations E1 and E2. The elevations E2 are arranged in the region 31 and spatially separated in each case from the elevations E1. Furthermore, the elevations E2 are enclosed by in each case a continuous elevation E1. The elevations E1 have a maximum height H1 of 6 µm and are embodied in "U"-shaped fashion in accordance with FIG. 1B. That is to say that they have a planar top area and form truncated pyramids, for example. The elevations E2 have a maximum height H2 of 1.5 µm. The photoresist 2 has a thickness DF of more than 6 µm such that the elevations E1 are completely enclosed by the photoresist 2 during the impressing process.

In a next method step, the patterned surface 11 of the wafer 1 is pressed, for example, into the photoresist 2 such that the patterned surface 11 of the first wafer 1 is completely impressed into that surface of the photoresist 2 which faces away from the second wafer 3. Therefore, the negative form of the patterned surface 11 of the first wafer 1 is applied on that surface of the photoresist 2 which faces away from the second wafer 3. After the structure has been impressed, the wafer 1 is removed from the photoresist 2 and a patterned surface 21 remains. The surface 21 is therefore the negative form of the surface 11, wherein the elevations E1 and E2 of the first wafer are respectively reproduced as trenches G1 and G2 into the photoresist 2.

The patterned surface 11 of the first wafer 1 therefore serves as a stencil for the structures impressed into the surface of the photoresist 2.

Advantageously, the wafer 1 can be multiply reused for the patterning of further photoresist layers, which not only leads to a considerable time saving in the manufacturing process but also has a cost-saving effect on the entire production process.

The application of a patterning method 6 to the patterned surface 21 of the photoresist 2 is shown in a further step. The patterning method 6 is a dry-chemical etching process 61. By way of example, this can be reactive ion etching (RIE) or ion beam etching (IBE). Preferably, the dry-chemical etching process 61 is a plasma etching process.

At places of the second wafer 3 at which the photoresist 2 is very thin, the photoresist 2 is etched away rapidly. After just a short etching duration, the photoresist 2 is removed at the thinly coated places, while residues of the photoresist 2 are still present at other places of the second wafer 3 that are coated more thickly with photoresist 2. At places, however, at which the photoresist 2 is thicker, a very small etching depth into the second wafer 3 is achieved. That is to say that after a specific etching duration at the places coated thinly with photoresist 2, etching into the second wafer 3 already occurs, while at the more thickly coated places the photoresist 2 is still present at least in places and is etched away.

If a desired and predeterminable structure of the surface 33 of the second wafer 3 has then been achieved, the etching process can be stopped. Furthermore, the etching process can be set by a predeterminable selectivity with respect to the materials of the photoresist 2 and of the second wafer 3. A selectivity of 1:1 was chosen with regard to the etching method. That is to say that the etching method, for example with regard to its etching rate, has the same etching rate both during the etching of the photoresist 2 and during the etching of the wafer 3. This can lead to an identical or almost identical reproduction of the trenches having a first and second depth from the patterned photoresist layer 21 onto the surface of the second wafer 3. The trenches having a first depth are constituted in terms of their depth T1 such that they interrupt the active layer A in a vertical direction as shown in FIG. 1C. "Vertical" means perpendicular in one direction with respect to a main extension plane of the second wafer 3. The trenches having a first depth have a maximum depth T1 of 6 µm. Furthermore, the trenches having a second depth have a maximum depth T2 of 1.5 µm and do not interrupt the active layer A. Furthermore, the trenches having a second depth G2 form a coupling-out structure AS.

In a further step, the second wafer 3 can then be singulated into individual semiconductor chips HLC. The trenches having a first depth advantageously serve for this purpose as "desired breaking places", at which the second wafer 3 can be broken into individual semiconductor chips HLC. It is likewise possible for the second wafer to be singulated into individual semiconductor chips at the places of the trenches having a first depth by sawing, cutting or high-energy laser light.

The method described in FIGS. 1A, 1B and 1C makes it possible in this way advantageously to introduce the two patterning profiles of the coupling-out structure AS and of the trenches having a first depth into the wafer 3 in one process sequence. In the process sequence, it is merely necessary to effect a single coating of the wafer 1 with photoresist. Our method thus at least obviates repeated time-consuming and costly exposure, coating with photoresist and etching.

Furthermore, our method affords the advantage of reusing the wafer 1 as a stencil for a multiplicity of further patterning methods, which leads to additional cost savings.

FIGS. 2A, 2B, 2C and 2D show a further example of individual manufacturing steps for producing the patterned surface 33 of the wafer 3.

Figure 2A:
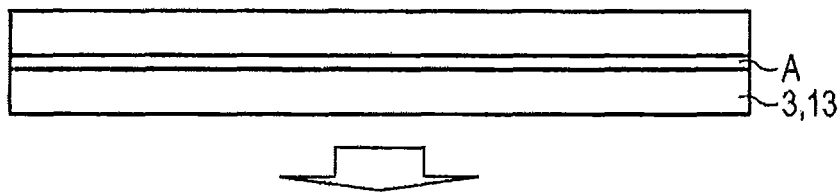
Figure 2B:
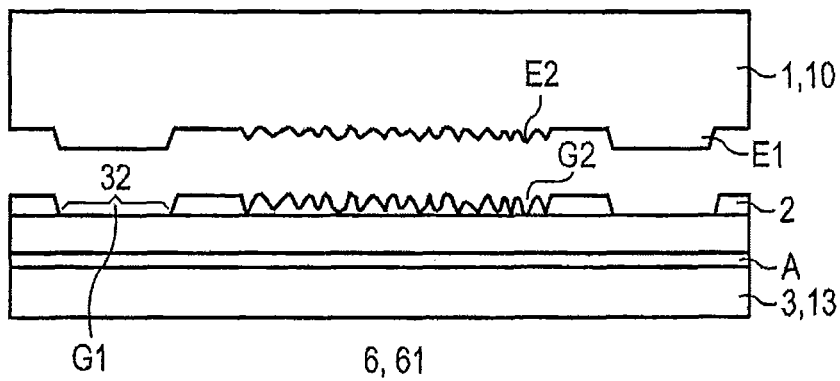

In contrast to the production method in accordance with FIGS. 1A, 1B and 1C, in this case the patterning method 6 consists of exactly one dry- and one wet-chemical etching process 62 and 61. For this purpose, first, the photoresist 2 is applied to the wafer 3 so thinly that the photoresist 2, after the impressing process, has at the regions 32 only a layer thickness which is negligible in comparison with the photoresist 2 present outside the regions 32, as shown in FIGS. 2A and 2B. Before the application of the dry-chemical etching process 61 at regions 32, the photoresist 2 residually left on the surface 21 after the impressing process is preferably removed as shown in FIG. 2B. The removal preferably takes place by a plasma etching process. The photoresist 2 can likewise be removed by blasting or polishing, for example.

Figure 2C:
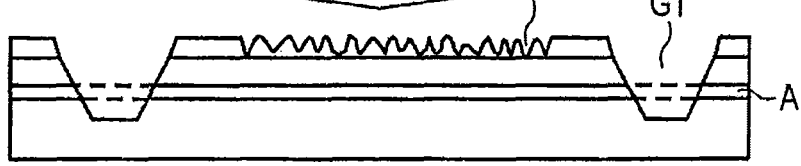

In a further step, the dry-chemical etching process 61 is then applied at least to the region 32 freed of the photoresist as shown in FIG. 2C. By the etching process 61, the trenches having a first depth are introduced into the second wafer 3. Once a desired etching depth and/or shape of the trenches having a first depth has been achieved, the dry-chemical etching process 61 is terminated. The trenches having a first depth have the same geometrical features with regard to shaping and depth as the trenches shown in FIG. 1B. Preferably, the photoresist 2 is "insensitive" relative to the dry-chemical etching process 61. In this context, "insensitive" means that the etching process has an especially great selectivity between the photoresist 2 and the material of the second wafer 3 such that the etching rate in the photoresist is negligible relative to that in the second wafer 3. The etching process 61 can thus advantageously be applied to the entire patterned surface 21 of the photoresist 2 without selective measures.

Figure 2D:
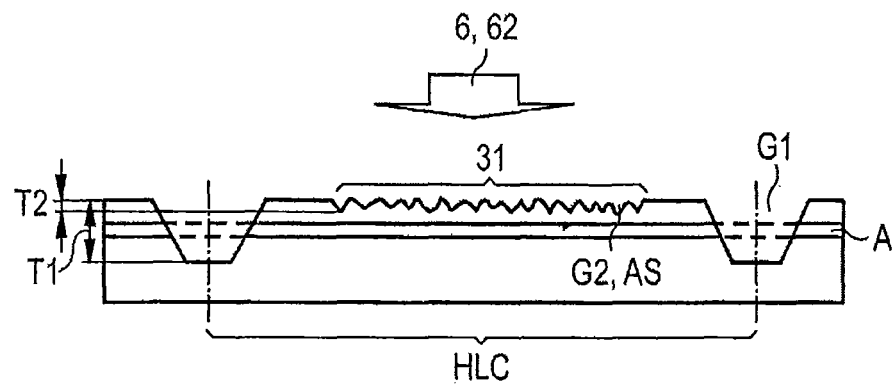

In a further step, the wet-chemical etching process 62 is applied to the patterned surface 21 of the photoresist 2. A coupling-out structure AS is formed analogously to the method described in FIGS. 2A, 2B, 2C and 2D. In this case, too, the coupling-out structure AS, as shown in FIG. 2D, corresponds to the coupling-out structure as shown in FIG. 1C.

In a further step, the second wafer 3 can then once again be singulated into individual semiconductor chips, as already described in the case of the production method in accordance with FIGS. 1A, 1B and 1C.

This disclosure is not restricted by the description on the basis of the examples. Moreover, the method encompasses any novel feature and also the combination of features, which in particular includes any combination of features in the appended claims, even if the feature or the combination itself is not explicitly specified in the claims or the examples.

The invention claimed is:

1. A method of producing an optoelectronic semiconductor component comprising:
    providing a first wafer having a patterned surface, wherein the patterned surface is formed at least in places by elevations having first and second heights, and the first height is greater than the second height;
    providing a second wafer;
    applying a photoresist to outer areas of the second wafer;
    patterning a surface of the photoresist facing away from the second wafer by impressing the patterned surface of the first wafer into the photoresist, wherein the elevations are impressed as trenches having a first and second depth into the photoresist; and
    applying a patterning method to the patterned surface of the photoresist, wherein 1) the structure applied on the photoresist is transferred at least in places to the outer area of the second wafer, and 2) the second wafer is a semiconductor wafer and the second wafer has at least one active zone that generates electromagnetic radiation.

2. The method according to claim 1, wherein, before the patterning method is applied, the photoresist is removed from the outer areas of the second wafer at the places at which the trenches having a first depth are pressed into the photoresist.

3. The method according to claim 1, wherein the trenches having a first depth which are introduced into the second wafer extend at least as far as the active zone.

4. The method according to claim 1, wherein the trenches having a first depth perforate the at least one active zone of the second wafer.

5. The method according to claim 1, wherein the trenches having a first depth laterally surround the trenches having a second depth.

6. The method according to claim 1, wherein the trenches having a second depth form a coupling-out structure.

7. The method according to claim 1, wherein the second wafer is singulated into individual radiation-emitting semiconductor chips in a region of the trenches having a first depth.

8. The method according to claim 1, wherein the trenches having a first depth are "U"-shaped.

9. A method of producing an optoelectronic semiconductor component comprising:
    providing a first wafer having a patterned surface, wherein the patterned surface is formed at least in places by elevations having first and second heights, and the first height is greater than the second height;
    providing a second wafer;
    applying a photoresist to outer areas of the second wafer;
    patterning a surface of the photoresist facing away from the second wafer by impressing the patterned surface of the first wafer into the photoresist, wherein the elevations are impressed as trenches having a first and second depth into the photoresist; and
    applying a patterning method to the patterned surface of the photoresist, wherein the structure applied on the photoresist is transferred at least in places to the outer area of the second wafer, the first wafer is a semiconductor wafer or the first wafer is a plastics material.

10. A method of producing an optoelectronic semiconductor component comprising:
    providing a first wafer having a patterned surface, wherein the patterned surface is formed at least in places by elevations having first and second heights, and the first height is greater than the second height;
    providing a second wafer;
    applying a photoresist to outer areas of the second wafer;
    patterning a surface of the photoresist facing away from the second wafer by impressing the patterned surface of the first wafer into the photoresist, wherein the elevations are impressed as trenches having a first and second depth into the photoresist; and
    applying a patterning method to the patterned surface of the photoresist, wherein the structure applied on the photoresist is transferred at least in places to the outer area of the second wafer, and the patterning method is a single dry-chemical etching process or the patterning method consists of at least one dry- and one wet-chemical etching processing.

11. The method according to claim 10,
    wherein the patterning method consists of exactly one dry-chemical etching and exactly one wet-chemical etching process,
    the dry-chemical etching process is applied at least to a region freed of the photoresist,
    the photoresist is insensitive relative to the dry-chemical etching process, and
    the wet-chemical etching process is applied to the patterned surface of the photoresist.

* * * * *